United States Patent
Shilton

(12) 
(10) Patent No.: US 6,415,309 B1
(45) Date of Patent: Jul. 2, 2002

(54) METHOD OF AND APPARATUS FOR GENERATING RANDOM NUMBERS

(76) Inventor: Mark G. Shilton, 1 Warwick Close, Aston Clinton, Buckinghamshire, Buckinghamshire (GB), HP22 5JF ( * ) Notice: Subject to any disclaimer, the term of this patent is extended or adjusted under 35 U.S.C. 154(b) by 0 days.

(21) Appl. No.: 09/242,009
(22) PCT Filed: Aug. 6, 1997
(86) PCT No.: PCT/GB97/02121
§ 371 (c)(1),
(2), (4) Date: Jun. 4, 1999
(87) PCT Pub. No.: WO98/06175
PCT Pub. Date: Feb. 12, 1998

(30) Foreign Application Priority Data

Aug. 6, 1996 (GB) .......................................... 96305778

(51) Int. Cl.⁷ ............................................... G06F 1/02
(52) U.S. Cl. ...................................... 708/250; 708/255
(58) Field of Search ................................ 702/250, 251, 702/252, 253, 254, 255

(56) References Cited

U.S. PATENT DOCUMENTS

| 3,946,215 A | 3/1976 | May |
| 4,176,399 A | 11/1979 | Francis et al. |
| 4,516,217 A | 5/1985 | Starner |
| 4,535,466 A | 8/1985 | Palvolgyi |

FOREIGN PATENT DOCUMENTS

| GB | 829 361 A | | 3/1960 |
| GB | 2 163 627 A | | 2/1986 |
| JP | 406154411 A | * | 6/1994 |
| JP | 407162275 A | * | 6/1995 |

OTHER PUBLICATIONS

Castanie: "Generation of Random Bits with Accurate and Reproducible Statistical Properties" Proceedinsg of the IEEE, vol. 66, No. 7, Jul. 1978, New York, US, pp. 807–809, XP002022447 see the whole document.

Takeuchi et al.: "High Performance Random Pulser Based On Photon Counting" IEEE Transafctions on Nuclear Science, vol. NS–33, No. 1, Feb. 1986, New York US, pp. 946–949, XP002022448 see the whole document.

Gavel: GENAP–3 Random Process Generator: Automation and Remote Control, vol. 36, No. 3 II, Mar. 1975, New York US, pp. 502–506, XP002022449 see the whole document.

Patent Abstracts of Japan, vol. 0008, No. 001 (P–246), Jan. 6, 1984 & JP 58 166 448 (Nippon Denki KK), Oct. 1, 1983, cited in the application see abstract.

* cited by examiner

*Primary Examiner*—Chuong Dinh Ngo
(74) *Attorney, Agent, or Firm*—Nixon & Vanderhye P.C.

(57) ABSTRACT

For generating random numbers, the output of a random pulse generator having a radioactive source is monitored and the number of decay events detected counted over a predetermined time period. The number of detected events is then compared to one or more selected numbers and a first signal, for example binary "1", is produced where the detected count is equal to the one or more selected numbers and a second signal, binary "0", is produced where the detected count does not equal the one or more selected numbers. The time period is determined so that the probability of the first signal being generated is equal to the probability of the second signal being generated. In this way a truly random number can be generated by repetition of the method steps described above producing a stream of binary "1's" and "0's". Virtually no radioactivity is required for the apparatus to operate and it can in principle be integrated into a single chip.

17 Claims, 1 Drawing Sheet

METHOD OF AND APPARATUS FOR GENERATING RANDOM NUMBERS

FIELD OF INVENTION

The present invention relates to a method of an apparatus for the generation of random numbers. In particular, but not exclusively, the present invention relates to the use of a random pulse generator employing a radioactive source in the generation of random numbers.

BACKGROUND AND SUMMARY OF THE INVENTION

Current methods for generating random numbers commonly employ mathematical algorithms using a fairly simple computer program and an 8–24 bit processor. The mathematical algorithms produce a stream of numbers which are calculated from an initial seed number using various possible mathematical formulae. Each random number generated is then used as the seed number for the next calculation. Such algorithms generate numbers which are generally described as pseudo-random because they are based on a calculation and so there is always a chance that a seed number will be repeated which would result in an infinite closed loop of repeated sequences of numbers.

Alternative known methods for generating random numbers employ natural unpredictable processes such as black body radiation, Brownian motion or radioactive decay. In JP 58-166448 the generation of long period pseudo-random numbers is described in which millicurie alpha radiation from radioactive uranium irradiates a 64,000 bit RAM. All of the bits of the RAM are initially set to '0' and each of the bits individually reset to '1' in the event an alpha particle is incident on the bit. After a predetermined period of time the number generated within the RAM is read as a pseudo-random number. With this method, pseudo-random numbers are generated by the spatial distribution of alpha particles incident on the RAM as a result of radioactive decay. However, the device described for generating the numbers is cumbersome, as it is necessary for the radioactive source to be positioned away from the RAM. Also, the device requires levels of radioactivity which for health reasons limit the situations in which the device could be used.

The present invention seeks to provide a method of and apparatus for the generation of random numbers which overcome at least some of the disadvantages with known methods described above. Moreover, where radioactive decay is used in the method the present invention provides apparatus which employs sufficiently low levels of radioactivity that the apparatus may be deemed to operate with 'virtually no radioactivity' (VNR).

The present invention provides a method of generating random numbers comprising detecting radioactive decay events during a predetermined time period, comparing the detected events to a selected output and generating a first signal where the detected events correspond to the selected output or generating a second signal where the detected events correspond to an output other than the selected output, wherein the time period is determined such that the probability of the detected events corresponding to the selected output is substantially equal to the probability of the detected events corresponding to an output other than the selected output.

Ideally, the time period is determined by measuring the mean number of radioactive decay events and calculating a time period for which the probability of the selected output being detected is ½. In a preferred embodiment the steps of detecting radioactive decay events, comparing the detected events with a selected output and generating first or second signals are repeated cyclically to produce a string of first and second signals. In this way, as the predetermined time period is calculated so that the probability of the selected output being detected is equal to the probability of any output other than the selected output being detected, a truly random number can be generated from the string of first and second signals generated through repetition of the above mentioned steps.

Preferably, the first and second signals are binary bits and the series of bits are grouped to form binary numbers. The reverse binary number may also be determined from the binary bits and both the binary numbers and the reverse binary numbers may be converted into analogue numbers.

Additionally, the predetermined time period may be adjusted in dependence on the detected mean. The detected mean can be determined by summing repeated detected numbers of decay events to calculate a total output and then dividing the total output by the summed total of the time periods during which decay events were detected.

In an alternative method the individual outputs of a plurality of radioactive random event sources are detected during respective predetermined time periods and each detected output is compared to the selected output thereby generating a plurality of first or second signals simultaneously.

In a further aspect the present invention provides apparatus for generating random numbers comprising a decay detector for detecting radioactive decay events; a timer for controlling the time period during which decay events are detected by the decay detector; a comparator device for comparing the detected events with a selected output; and a number generator for generating a first signal when the detected events corresponds to the selected output and for generating a second signal when the detected events corresponds to an output other than the selected output.

Preferably, the decay detector includes a radioactive source and a detector in the form of a semiconductive substrate sensitive to the irradiation of decay products. For example the detector may be a PIN diode. Ideally, the apparatus is mounted on and forms part of a semiconductor chip.

Memory means may be provided for storing sequentially generated first and second signals thereby to form a random binary number and a digital-to-analogue converter may be provided for converting the stored random binary number into an analogue number.

Additionally, a feedback device may be provided for adjusting the predetermined time period in dependent on the detected mean output of the random event source.

DETAILED DESCRIPTION OF THE INVENTION

Figure 1:
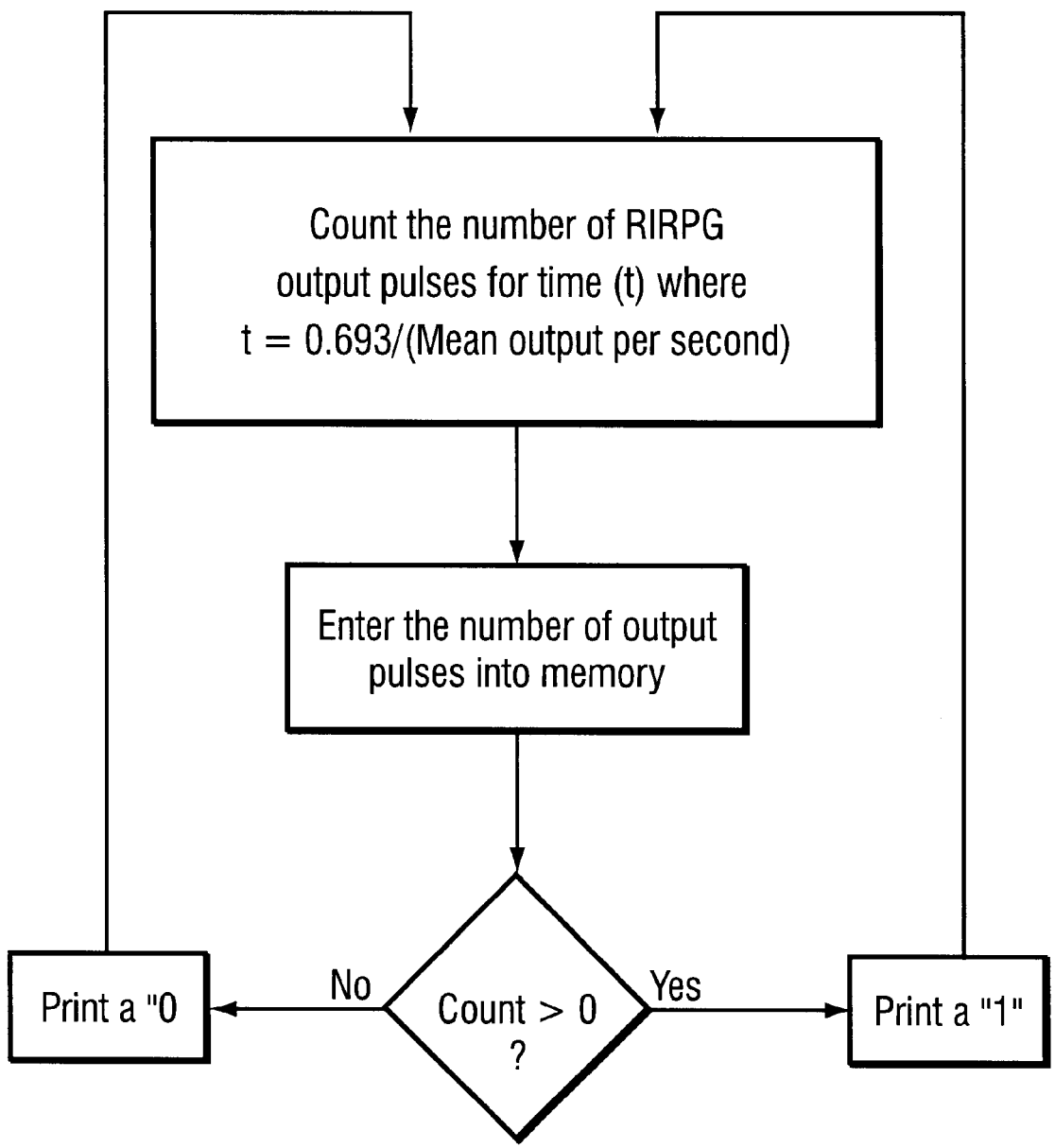
FIG. 1 is a diagram of the logic operations performed in the example described below.

An embodiment of the present invention will now be described, by way of example, with reference to the following explanation of the probability theory upon which the present invention is based and the detailed example given below and FIG. 1.

Theory

The present invention is based on the realisation that a random event source such as a random pulse generator (RPG) can generate random numbers where the mean pulse output of the RPG is set so that there is equal probability of the RPG generating a selected output or any other output during a fixed period. This requires the probability to be ½ for the selected output being generated and hence the probability is also ½ for any other output being generated.

The probability of an RPG emitting an output of m pulses in a fixed time is described by the Poisson probability function:

$$^{M}P_m = M^m \cdot e^M / m!$$

where m is the number of random pulses which occur during measurement, M is the mean pulse output per measurement and $^{M}P_m$ is the probability of m pulses occurring.

For the case where the selected output is no pulses and any other output is therefore one or more pulses, the probability of the RPG emitting nothing during the fixed time is:

$$^{M}P_0 = M^0 \cdot e^{-M}/0! = e^{-M}$$

Since the probability of the selected output being generated is to equal ½, $e^{-M} = ½$ which can be solved giving M=ln2=0.693147181 . . .

Other similar formulae can be derived for different selected outputs. For instance the probability of the RPG generating 0 or 1 as the selected output is as follows:

$$^{M}P_{0\,or\,1} = M^0 \cdot e^{-M}/0! + M^1 \cdot e^{-M}/1! = e^{-M}(1+M)$$

which in turn gives:

$$e^{-M}(1+M) = ½ \text{ and } M = 1.67835$$

Of course this mean pulse output also provides a probability of ½ for the RPG generating an output other than 0 or 1 (i.e. 2 or more) in the fixed time.

It will be clear from the above that the mean pulse output can be determined for any selected output(s) in which the probability of the selected output(s) being generated is ½. In general alternative selected output(s) do not provide any advantages over the examples given above.

Method

In order to generate a random number a random event source for example an RPG is set up so that there is equal probability of a selected output, in the case of an RPG a selected number of pulses, being detected as there is of any other output or any number of pulses other than the selected number being detected. The number of events generated by the source is counted for a predetermined fixed time period and the total number counted compared to the selected output. Where the number of events counted is equal to the selected output a binary '1' is generated whereas where the number of events counted is different to the selected output a binary '0' is generated. The procedure is then repeated one or more times to generate a string of binary digits with the total number of times the procedure is performed being equal to the number of digits desired in the binary number so formed. As the probability of generating either a binary '1' or a binary '0' is equal, all equal length sequences of '1's and '0's have an equal probability of occurring and so the strings of numbers are truly random. The resultant random number may be retained in binary form or may be converted to the equivalent analogue number.

It will of course be immediately evident that the circumstances in which a binary '1' or a binary '0' is generated may be reversed or may be altered each time the procedure is repeated. Moreover, where the selected output is no output pulses the number of pulses generated during the predetermined time period need not be counted. Instead, generation of a binary '1' or '0' results from a switch which is activated when a first pulse is detected.

Apparatus

The apparatus consists of a random event source and respective event detector. The detector is connected to a counter and a clock so that the number of events detected may be counted over a predetermined time period. The counter is in turn connected to a comparator which compares the output of the counter with a selected output stored in an associated memory. A multibit RAM with a shift register is connected to the output of the comparator so that sequential outputs from the comparator may be stored in sequential bits of the RAM. Where the selected output is one or more events then the counter and comparator are not required and instead the detector may be connected directly to the RAM.

The random event source is preferably in the form of a low activity radiation source RPG which emits alpha, beta, gamma, x-ray, conversion electron, auger electron or other random radiation emissions arising from radioactive decay. The preferred emissions are substantially mono-energetic alpha particles or conversion electrons and ideally the emissions are alpha particles from a radionuclide with a long half-life such as $^{241}$Am, $^{252}$Cf, $^{250}$Cf, $^{226}$Ra, $^{238}$U, $^{244}$Cm, $^{243}$Cm, $^{223}$Th, $^{208}$Po, $^{209}$Po, $^{210}$Po, $^{238}$Pu or $^{148}$Gd or a combination of these. The radionuclide in the RPG may be in the form of a small piece of thin metal foil or may be deposited on a separate substrate. In both cases the radionuclide is positioned within a few microns of the surface of the detector. The detector may be in the form of a simple PIN diode comprising a small piece of silicon or other solid state semiconductive material susceptible to radioactive emissions. The radionuclide may alternatively be deposited directly onto a semiconductor chip which acts as the substrate. When a bias voltage is applied to the detector, alpha particles emitted by the RPG which are incident on the detector produce a voltage and/or current pulse which can be detected and counted by suitable associated circuitry as described above. Alternatively, only a decay detector need be employed where natural background radiation is to be detected.

An RPG which is suitable for generating random numbers may have a mean pulse output between $10^{-3}$ and $10^6$ pulses per second. The preferred mean output per second is $10^{-1}$ and $10^4$ pulses, more preferably 1–1000 pulses per second. The desired mean output is dependent on the output rate of the RPG which is required for the particular application concerned. For example, an RPG having a mean output of 10 pulses per second may contain around 0.7 nCi of a radioactive alpha emitting nuclide with a PIN diode detector having an overall efficiency of around 40%. In practice the mean output of the RPG must be determined experimentally by timing the generation of around 1000 pulses. With the RPG described above the measurement would take around 100 seconds. The statistical uncertainty in this measurement gives rise to an uncertainty of +/−3.16% (with a confidence level of 68% or 1 standard deviation) in the measured output of the RPG.

Once the mean output of the RPG is known the time period in which pulses from the RPG must be counted can be calculated to ensure a probability of ½ for the selected number of pulses being generated. With the selected number of pulses being zero and the RPG described above the measurement time period is ln2/10=0.0693 seconds (+/−3.16%).

As may be seen from FIG. 1, a counter circuit connected to the RPG counts the number of pulses generated by the RPG in predetermined time period which in this example is 0.0693 seconds. The result of the count is entered into the memory of a control chip which is programmed to interrogate the memory and produce a '0' if the count is zero or a '1' if the count is non-zero, or vice versa.

The RPG output is counted repeatedly which results in the control chip producing a continuous random stream of '0's and '1's. The random digits may be used immediately or may be stored in a RAM having a shift register so that sequentially generated digits are stored sequentially in the RAM. With a mean output of 10 pulses per second, around 15 digits per second are produced. It will be apparent that the rate of production of the digits is dependent on the radioactivity of the RPG. As a general rule of thumb 1 nCi gives rise to about twenty-one '0's and '1's per second assuming 40% overall detection efficiency. An exception to this rule is $^{226}$Ra which emits five alpha particles per decay. In this case the rate of production per nCi is five times faster (i.e. =105 '0's or '1's per second per nCi).

A hypothetical example of the output of the device described above is given below:
   RPG output (counts) (0020113000100102) (2111010000012104)(01000 . . . The mean output of this hypothetical stream is =In2 pulses per measurement (i.e. 26 pulses in 37 measurements=0.7 per measurement).
   Control chip output (0010111000100101) (1111010000011101)(01000 . . . reverse chip output (1101000111011010)(0000101111100010)(10111 . . .
The random stream of '0's and '1's is used to construct binary numbers by grouping the stream of digits into blocks. For example, with blocks of 16 digits, random numbers up to 65536 can be produced. In this example the digits enclosed in brackets produce the following numbers:
   1) 0010111000100101=11813  1101000111011010=53722 (reverse chip output)
   2) 1111010000011101=62493  0000101111100010=3042
Of course blocks of different lengths may be employed as appropriate.

Instead of the bits of the binary number being generated sequentially in a stream, a bank of RPGs may be employed each generating a respective random bit of the binary number. A separate time period must be determined for each RPG to ensure that the probability of each individual RPG generating the selected output is ½. In this way the bits of the binary number can be generated substantially simultaneously which naturally enables random numbers to be generated more quickly than is the case where each bit of the binary number is generated sequentially.

In a practical device it will never be possible to set the mean output to be exactly a probability of ½ because there will always be some statistical uncertainty in the measurement of the mean output. In addition there will be a drift in the performance of the device over its working life due to radioactive decay or degradation of the PIN detector diode for example. These effects will cause the device to produce slightly more '0's or '1's on average depending on how much lower or higher the mean output is from the desired value.

Even if the mean output is not set exactly the stream of '0's and '1's would never-the-less be random and unpredictable. It is only the occurrence probability of the random numbers which would not be equal. In other words some binary numbers with more '0's than '1's would occur slightly more frequently than those with more '1's than '0's (or vice versa). For most applications this is not a problem. If necessary the method described below can assist in ensuring accuracy in the desired mean output.

Where the mean output of the RPG does not match exactly the desired mean output there will be a bias in the output to produce more '0's on average if the measurement time period is too short or more '1's if the time period is too long. To improve the accuracy of the device a feedback mechanism may be included which monitors the mean output of the RPG. The feedback device operates to sum the pulse outputs of the RPG to determine a cumulative total pulse output and at the same time records the total measurement time. This data is then used to calculate the actual mean output of the RPG which is then used to adjust the measurement time period, if necessary. The statistical nature of radioactive decay ensures that any bias will progressively diminish the longer the device operates.

In addition to the feedback device enabling accurate measurement time periods to be determined, with the feedback device shorter lived radioisotopes such as $^{252}$Cf (2.64y) or $^{208}$Po (2.9y) can be used. Such shorter lived radioisotopes provide additional environmental and regulatory benefits in so far as they leave no trace of radioactivity behind in the material after a useful working life of say 5 to 10 years.

Although reference above has been made exclusively to a device using radioactive decay as the source of random events it will be understood that the method and the apparatus may employ any random or pseudo-random process which produces discrete, detectable events. In addition, the means for recording the events and the control circuitry for generating the random binary numbers may be altered whilst still ensuring the occurrence of the random events are employed in the generation of the random numbers which may be binary or may use alternative bases.

As mentioned earlier with the method described the apparatus for generating random numbers can be made very small, indeed small enough to be formed on a semiconductor chip and because of the very low radioactivity content no special shielding is necessary and the apparatus will not fall under the statutory controls which restrict the use of materials having higher radioactivity. This in turn means that the apparatus can be used in general consumer products. In addition, unlike mathematical algorithms, the method described can provide true random numbers.

The method and apparatus is therefore suited for use in a wide variety of applications including security monitoring and control, statistical quality control and analysis, gaming machines and encryption. For example, the apparatus may be used with smart card technology so that the smart card generates a new random number each time the card is used which is then repeated on a subsequent occasion as identification.

What is claimed is:

1. A method of generating random numbers comprising:
   detecting radioactive decay events during a predetermined time period;
   comparing the detected events to one or more predetermined results;
   generating a first signal where the detected events correspond to the one or more predetermined results; and
   wherein the time period is determined such that the probability of the detected events corresponding to the one or more predetermined results is substantially equal to the probability of the detected events corresponding to an output other than the one or more predetermined results, and
   wherein a plurality of said first and/or second signals generated either consecutively or simultaneously form a string that is representative of a random number.

2. A method as claimed in claim 1, wherein the steps of detecting radioactive decay events, comparing the detected events with one or more predetermined results and generating first or second signals are repeated cyclically to produce the string of first and second signals.

3. A method as claimed in claim 1, wherein the first and second signals are binary bits and the bits are grouped to form binary numbers.

4. A method as claimed in claim 3, wherein reverse binary numbers are also determined from the binary bits.

5. A method as claimed in claim 1, wherein the first and second signals are binary bits and the bits are grouped to form binary numbers and/or reverse binary numbers which are converted into analogue numbers.

6. A method as claimed in claim 1, wherein no counting of the detected events is performed and the predetermined result is one or more detected events whereby the first signal is generated when at least one radioactive decay event is detected during the predetermined time period and the second signal is generated when no radioactive decay events are detected during the predetermined time period.

7. A method as claimed claim 1, wherein the radioactive decay events are detected using a random event generator having a radioactive source.

8. A method as claimed in claim 7, wherein radioactive decay events are simultaneously separately detected using a plurality of random event generators during respective time periods and outputs from each of the random event generators are compared to the one or more predetermined results thereby generating a plurality of first and/or second signals simultaneously.

9. A method as claimed in claim 1, comprising the further step of determining the time period during which decay events are to be detected including measuring the mean number of radioactive decay events.

10. Apparatus for generating random numbers comprising:

a decay detector for detecting radioactive decay events;

a timer for controlling the time period during which decay events are detected by the decay detector;

a comparator device for comparing the detected events with one or more predetermined results, whereby the time period is determined such that the probability of the detected events corresponding to the one or more predetermined results is substantially equal to the probability of the detected events corresponding to an output other than the one or more predetermined results; and a number generator for generating a first signal when the detected events corresponds to the one or more predetermined results, for generating a second signal when the detected events corresponds to an output other than the one or more predetermined results and for collecting a plurality of first and/or second signals generated either consecutively or simultaneously into a string that is representative of a random number.

11. Apparatus as claimed in claim 10, including a memory for storing sequentially generated first and second signals as binary bits thereby to form a random binary number.

12. Apparatus as claimed in either of claim 10, wherein the decay detector includes a radioactive source.

13. Apparatus as claimed in claim 12, wherein the radioactive content of the source is less than 1 $\mu$Ci.

14. Apparatus as claimed in claim 13, wherein the radioactive content of the source is between $1\times10^{-8}$ and $1\times10^{-10}$ Ci.

15. Apparatus as claimed in claim 10, wherein there is further included a counter for counting the number of decay events detected by the decay detector during a predetermined time period.

16. Apparatus as claimed in claim 10, wherein the apparatus does not include an event counting device.

17. Apparatus as claimed in claim 16, wherein the comparator device is in the form of a switch device which switches between a first signal output and a second signal output in dependence on whether at least one decay event is detected by the decay detector during the predetermined time period.

* * * * *